(12) United States Patent
Tanaka et al.

(10) Patent No.: US 7,755,091 B2
(45) Date of Patent: Jul. 13, 2010

(54) SOLID STATE IMAGE PICKUP DEVICE

(75) Inventors: Shunsuke Tanaka, Miyagi (JP);
Tatsuya Hagiwara, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 898 days.

(21) Appl. No.: 11/604,209

(22) Filed: Nov. 27, 2006

(65) Prior Publication Data

US 2007/0159547 A1    Jul. 12, 2007

(30) Foreign Application Priority Data

Jan. 10, 2006    (JP) .............................. 2006-002447

(51) Int. Cl.
*H01L 21/00* (2006.01)
(52) U.S. Cl. .................. 257/72; 257/E33.053; 349/152
(58) Field of Classification Search .................... 257/59, 257/72, 432, E33.053; 349/152; 348/308
See application file for complete search history.

(56) References Cited

U.S. PATENT DOCUMENTS

| | | | | |
|---|---|---|---|---|
| 7,050,138 | B1 * | 5/2006 | Yamazaki et al. | 349/152 |
| 7,061,186 | B2 * | 6/2006 | Inukai et al. | 315/169.3 |
| 7,122,830 | B2 * | 10/2006 | Ishikawa et al. | 257/59 |
| 7,122,831 | B2 * | 10/2006 | Sumi | 257/59 |
| 7,129,532 | B2 * | 10/2006 | Lee | 257/228 |
| 7,129,556 | B2 * | 10/2006 | Kwon | 257/443 |
| 7,259,822 | B2 * | 8/2007 | Tsubokura et al. | 349/149 |
| 7,602,467 | B2 * | 10/2009 | Lee | 349/149 |
| 2007/0040983 | A1 * | 2/2007 | Ishii | 349/152 |
| 2009/0027530 | A1 * | 1/2009 | Suzuki et al. | 348/294 |

FOREIGN PATENT DOCUMENTS

JP    2003-224255 A    8/2003

* cited by examiner

*Primary Examiner*—Nathan W Ha
(74) *Attorney, Agent, or Firm*—Birch, Stewart, Kolasch & Birch, LLP (57) ABSTRACT

A solid state image pickup device is provided which includes: a semiconductor substrate having a light reception region; a well being formed in the semiconductor substrate; charge accumulation regions disposed in the well in a matrix shape; a vertical transfer channel disposed in the well; a light shielding film formed above the semiconductor substrate; and a horizontal transfer channel connected to the vertical transfer channels, wherein the light reception region includes: a first region in which an opening is formed through the light shielding film above each of the charge accumulation regions; a second region in which an opening is not formed through the upper light shielding film; and a third region defined between the first and second regions along the column direction of the charge accumulation regions, the third region not having at least partially the well and not having an opening formed through the upper light shielding film.

5 Claims, 4 Drawing Sheets

SOLID STATE IMAGE PICKUP DEVICE

CROSS REFERENCE TO RELATED APPLICATION

This application is based on and claims priority of Japanese Patent Application No. 2006-002447 filed on Jan. 10, 2006, the entire contents of which are incorporated herein by reference.

BACKGROUND OF THE INVENTION

A) Field of the Invention

The present invention relates to a solid state image pickup device, and more particularly to a solid state image pickup device having an optical black region.

B) Description of the Related Art

Figures 3A, 3B, 3C, 3D, 3E:
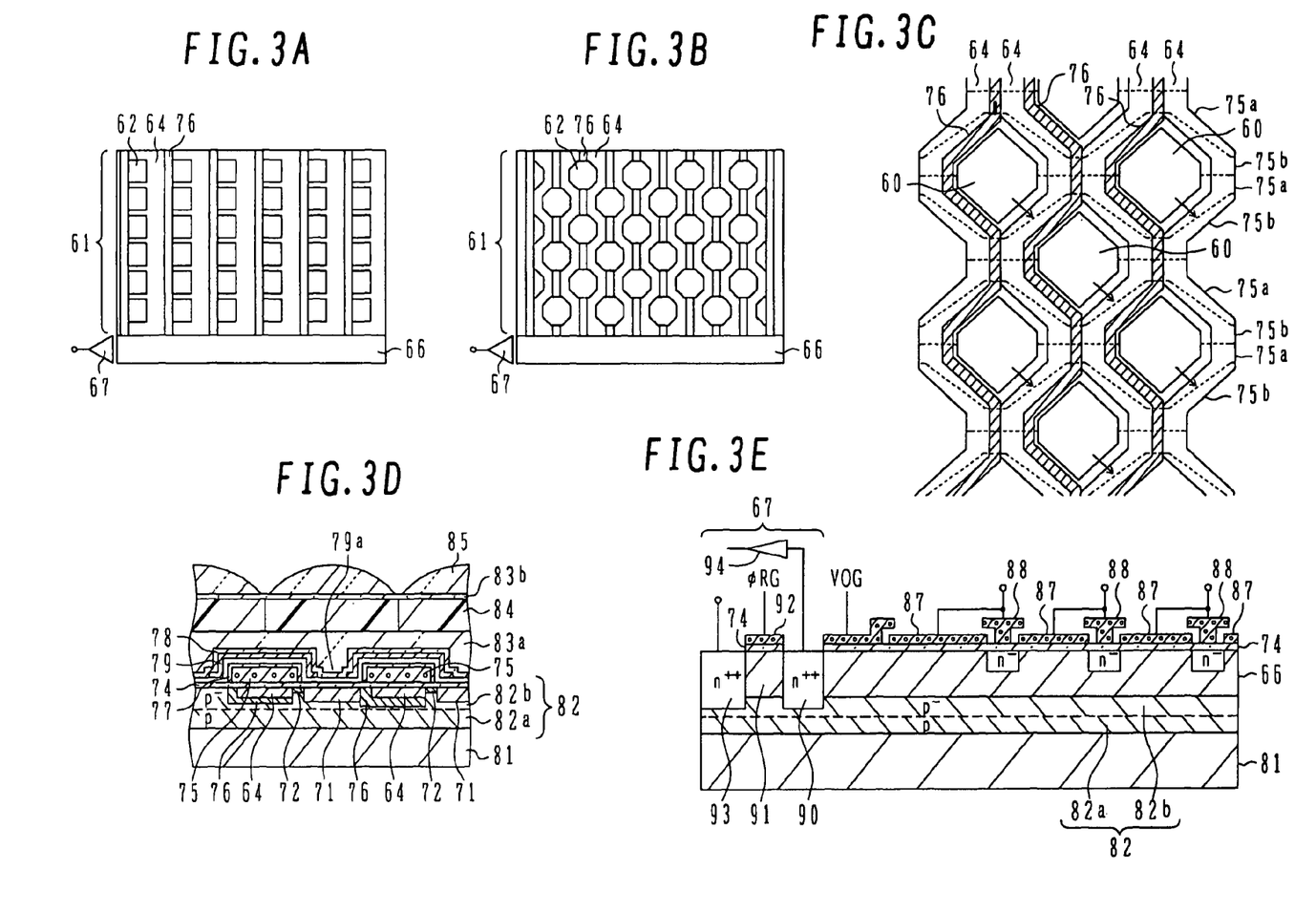
FIGS. 3A and 3B are schematic plan views showing the structure of CCD type solid state image pickup devices.
FIG. 3C is a schematic plan view showing a partial area of a light reception region of a CCD solid state image pickup device having a pixel interleaved array.
FIG. 3D is a schematic cross sectional showing a partial region of a light reception region of a CCD solid state image pickup device.
FIG. 3E is a schematic cross sectional view showing a partial region of a horizontal transfer channel and a charge detection unit of a CCD type solid state image pickup device.

With reference to FIGS. 3A to 3E, description will be made on the structure of a CCD type solid state image pickup device. FIGS. 3A and 3B are schematic plan views showing the structure of CCD type solid state image pickup devices, and FIG. 3C is a schematic plan view showing a partial area of a light reception region of a CCD solid state image pickup device having a pixel interleaved array. FIG. 3D is a schematic cross sectional view showing a partial region of a light reception region of a CCD solid state image pickup device, and FIG. 3E is a schematic cross sectional view showing a partial region of a horizontal transfer channel and a charge detection unit.

Reference is made to FIG. 3A. A CCD solid state image pickup device is constituted of: a plurality of photosensitive regions 62 disposed, for example, in a square matrix shape; a plurality of vertical transfer channels (vertical CCDs) 64 disposed along columns of the photosensitive regions 62; a channel stop region 76 disposed between adjacent vertical transfer channels 64; a horizontal transfer channel (horizontal CCDs) 66 electrically connected to the ends of the vertical transfer channels 64 outside a light reception region (pixel array region) 61; and a charge detection unit 67 coupled to one end of the horizontal transfer channel 66. The light reception region 61 is constituted of the photosensitive regions 62 and vertical transfer channels 64.

The photosensitive region 62 is constituted of a photosensitive element, e.g., a photodiode, and a transfer gate. The photodiode generates and accumulates signal charges corresponding to an incidence light amount. The accumulated signal charges are read to the vertical transfer channels 64 via transfer gates and transferred in the vertical transfer channels 64 along a direction (vertical direction, column direction) toward the horizontal transfer channel 66 as a whole. Signal charges transferred to the ends of the vertical transfer channels 64 are transferred into the horizontal transfer channel 66.

Signal charges transferred into the horizontal transfer channel 66 are transferred in the horizontal transfer channel 66 along a direction crossing the vertical direction as a whole, e.g., along a horizontal direction (direction perpendicular to the vertical direction, row direction), and thereafter transferred to the charge detection unit 67. In accordance with the signal charges transferred from the horizontal transfer channel 66, the charge detection unit 67 performs charges-voltage conversion and signal amplification. The amplified image signal is delivered to an external.

The array of photosensitive regions 62 includes a tetragonal array with the photosensitive regions being disposed in a square matrix along the row and column directions at constant pitches as shown in FIG. 3A, and in addition, a pixel interleaved array (PIA) having pixels disposed along the row and column directions by shifting the pixels, for example, a half pitch at every second rows and columns.

FIG. 3B is a schematic plan view of a CCD solid state image pickup device of the pixel interleaved array. The pixel interleaved array is an array of photosensitive regions disposed in a first square matrix shape and photosensitive regions disposed in a second square matrix shape at positions between lattice points of the first square matrix shape. The vertical transfer channel 64 is formed in a zigzag shape between photosensitive regions 62. Also in this case, signal charges are transferred in the vertical transfer channel 64 along a direction (vertical direction) toward the horizontal transfer channel 66 as a whole.

FIG. 3C is a schematic plan view showing some photosensitive regions of a CCD type solid state image pickup device of a pixel interleaved array. A vertical transfer channel 64 is formed along a column of photodiodes 60 disposed in a pixel interleaved array and in a zigzag shape between photodiodes 60. A channel stop region 76 is formed between adjacent columns of vertical transfer channels 64. The channel stop region 76 serves also as an isolation region between adjacent columns of photodiodes 60. Vertical transfer electrodes (a first layer vertical transfer electrode 75a and a second layer vertical transfer electrode 75b) are formed above the vertical transfer channels 64, covering the vertical transfer channels. Signal charges generated by photoelectric conversion of incidence light upon each photodiode 60 are read to the adjacent vertical transfer channel 64 when a read voltage is applied to the first layer vertical transfer electrode 75a. In FIG. 3C, the direction of reading signal charges is indicated by arrows. Signal charges read to the vertical transfer channel 64 are transferred in the vertical transfer channel 64 toward the horizontal transfer channel as a whole (along a downward direction in FIG. 3C).

FIG. 3D is a schematic cross sectional view showing a partial region of the light reception region of a CCD solid state image pickup device. For example, formed in a p-type well 82 (for example, constituted of a lower layer well p-type region 82a and an upper layer well p$^-$-type region 82b) formed in an n-type silicon substrate 81 with a high resistivity epitaxial layer are a charge accumulation region 71 made of an n-type impurity doped region and a vertical transfer channel 64 made of an n-type impurity doped region and being adjacent to a plurality of charge accumulation regions 71 and via an adjacent p-type transfer gate 72. A vertical transfer electrode 75 is formed above the transfer gate 72 and vertical transfer channel 64, with an insulating film 74 being interposed therebetween. A p-type or p$^+$-type channel stopper region 76 is formed between adjacent charge accumulation regions 71 and under the vertical transfer channel 64.

The channel stop region 76 electrically isolates the charge accumulation region 71, vertical transfer channel 64 and the like. The insulating film 74 is, for example, a lamination structure (ONO film) of an oxide film, a nitride film and an oxide film, formed on the surface of the silicon substrate 81. The vertical transfer electrode 75 includes a first vertical transfer electrode and a second vertical transfer electrode made of, for example, polysilicon. These electrodes may be made of amorphous silicon. The vertical transfer electrode 75 controls the potentials of the vertical transfer channel 64 and transfer gate 72 to read charges accumulated in the charge accumulation region 71 to the vertical transfer channel 64 and transfer the read charges in the vertical transfer channel 64 along the column direction.

An insulating silicon oxide film 77 is formed on the vertical transfer electrode 75, for example, by thermally oxidizing polysilicon.

A light shielding film 79 made of, for example, tungsten (W), is formed above the vertical transfer electrode 75 via the insulating silicon oxide film 77 and an insulating film of silicon oxide, silicon nitride or the like formed on the whole substrate surface by CVD or the like. An opening 79a is formed through the light shielding film 79 above the charge accumulation region 71. The light shielding film 79 prevents incidence light upon the light reception region 61 from entering the region other than the charge accumulation region 71. A silicon nitride film 78 is formed on the light shielding film 79. The silicon nitride film 78 is not necessarily required.

A planarizing layer 83a made of, for example, boro-phospho silicate glass (BPSG) is formed above the light shielding film 79. A color filter layer 84 of, e.g., three primary colors of red (R), green (G) and blue (B) is formed on the flat surface of the planarizing layer. In order to planarize the upper surface of the color filter layer, another planarizing layer 84B is formed. Micro lenses 85 are formed on a flat surface of the planarizing layer 84B, for example, by melting and solidifying a micro lens photoresist pattern. The micro lenses 85 are an array of, e.g., fine semispherical convex lenses disposed above the charge accumulation regions 71. Each micro lens 85 converges incidence light on the charge accumulation region 71. Light converged by each micro lens 85 passes through the color filter layer 84 of one of red (R), green (G) and blue (B) and becomes incident upon the corresponding charge accumulation region (photodiode) 71. A plurality of photodiodes include therefore three types of photodiodes: a photodiode upon which light transmitted through the red (R) color filter layer 84 becomes incident; a photodiode upon which light transmitted through the green (G) color filter layer 84 becomes incident; and a photodiode upon which light transmitted through the blue (B) color filter layer 84 becomes incident.

Signal charges accumulated in the charge accumulation region 71 and corresponding in amount to an incidence light amount are read to the vertical transfer channel 64 by a drive signal (read voltage) applied to the vertical transfer electrode 75 above the transfer gate 72, and transferred in the vertical transfer channel 64 by a drive signal (transfer voltage) applied to the vertical transfer electrode 75.

A positive voltage is applied to the semiconductor substrate 81 as a substrate drain voltage. Since the channel region 76 exists, a potential barrier between the charge accumulation region 71 and semiconductor substrate 81 is lower than a potential barrier between the vertical transfer channel 64 and semiconductor substrate 81. Therefore, for example, when excessive light enters the photodiode (charge accumulation region 71), charges (electrons) overflowing from the charge accumulation region 71 flow over the p-type barrier and into the n-type semiconductor substrate 81. This function is called a vertical type overflow drain (substrate drain shutter).

FIG. 3E is a schematic cross sectional view showing a portion of a horizontal transfer channel and a charge detection unit of a CCD type solid state image pickup device.

The n-type horizontal transfer channel 66 is formed, for example, in a p-type well 82 formed in a surface layer of an n-type semiconductor substrate 81. A first layer horizontal transfer electrode 87 and a second layer horizontal transfer electrode 88 are alternately formed along a longitudinal direction of the horizontal transfer channel 66 above the horizontal transfer channel 66, with an insulating film 74 being interposed therebetween.

A low impurity concentration region (n$^-$type region) formed in a region under an area between adjacent first layer horizontal transfer electrodes 87 forms a reverse flow preventive potential barrier, and an n-type region between the n$^-$type regions forms a potential well. One transfer stage is constituted of the potential well and the upstream side (right side) potential barrier. As described earlier, the charge detection unit 67 is formed at one end of the horizontal transfer channel 66.

The first layer horizontal transfer electrode 87 and second layer horizontal transfer electrode 88 are connected in common at each transfer stage. In response to a drive signal (transfer voltage) applied to the first layer horizontal transfer electrode 87 and second layer horizontal transfer electrode 88, signal charges are transferred in the horizontal transfer channel 66 along the horizontal direction toward the left. The first layer horizontal transfer electrode 87 and second layer horizontal transfer electrode 88 are made of polysilicon or amorphous silicon.

The horizontal transfer channel 66 at the last transfer stage is connected to a floating diffusion 90 of the charge detection unit 67 via a transfer unit to which an output gate voltage VOG is applied. Signal charges transferred in the horizontal transfer channel 66 are transferred to the charge detection unit 67 (floating diffusion 90).

The charge detection unit 67 includes: the n$^{++}$-type floating diffusion 90; an n-type reset gate RS 91, an n$^{++}$-type reset drain RD 93, a reset gate electrode 92 formed above the reset gate 91 with an insulating film 74 being interposed therebetween; and an amplifier 94 having a MOS transistor whose gate is electrically connected to the floating diffusion 90. The reset gate electrode 92 is made of polysilicon or amorphous silicon.

Signal charges are transferred from the horizontal transfer channel 66 to the floating diffusion 90. In the state when the floating diffusion 90 is electrically isolated, charges-voltage conversion is performed between the transferred charges and a capacitance of the floating diffusion 90. A converted voltage signal is amplified by the amplifier 94 and output as an image signal.

Figure 4A:
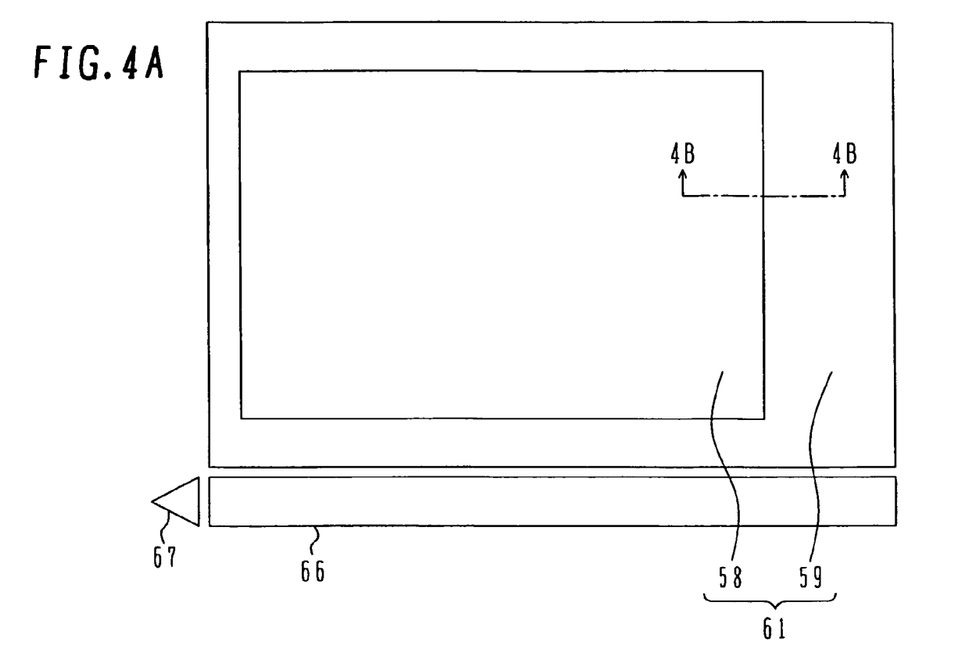
FIGS. 4A to 4C are diagrams illustrating a light reception region (pixel array region) more in detail.
Figure 4B:
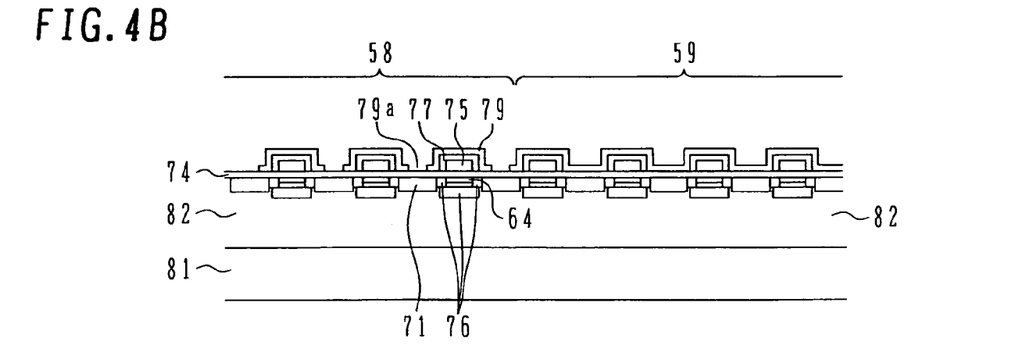
Figure 4C:
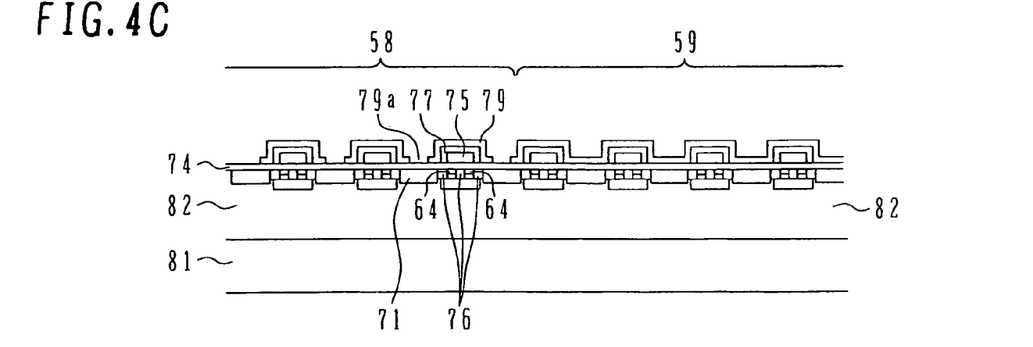

The signal charges transferred to the floating diffusion 90 are drained to the reset drain 93 via the reset gate 91 after the charges-voltage conversion and before signal charges of the next pixel are sent to the charge detection unit 67. A constant voltage φRG is applied to the reset gate electrode 92 for charge drain. With reference to FIGS. 4A to 4C, the light reception region (pixel array region) will be described more in detail.

FIG. 4A corresponds to FIGS. 3A and 3B and is a schematic plan view showing the structure of a CCD type solid state image pickup device. FIG. 4A does not show the photosensitive regions 62, vertical transfer channels (vertical CCDs) 64 and channel stop regions 76 shown in FIGS. 3A and 3B.

As shown in FIG. 4A, a light reception region (pixel array region) 61 is constituted of an effective pixel region 58 and an optical black region 59. The effective pixel region 58 is defined in a non-peripheral area (central area) of the light reception region (pixel array region) 61, for example, as a rectangular area. The optical black region 59 is defined in a peripheral area of the light reception region (pixel array region) 61, surrounding the effective pixel region 58.

FIG. 4B is a cross sectional view taken along line 4B-4B of FIG. 4A, assuming that FIG. 4A is a plan view of an inter-line transfer type solid state image pickup device such as shown in FIG. 3A. FIG. 4B is partially simplified more than the cross sectional view of FIG. 3D.

As described earlier, the light reception region (pixel array region) 61 includes the effective pixel region 58 and optical black region 59. In both regions, charge accumulation regions 71, vertical transfer channels 64 and channel stop regions 76 are formed in a well 82 formed in a semiconductor substrate 81, and vertical transfer electrodes 75, a silicon oxide film 77 and a light shielding film 79 are formed above the semiconductor substrate 81 formed with an insulating film 74.

In the effective pixel region 58, an opening 79a is formed through the light shielding film 79 above the charge accumulation region 71, whereas in the optical black region 59, no opening 79a is formed through the light shielding film 79 (the light shielding film 79 covers a region above the charge accumulation region 71).

FIG. 4C is a cross sectional view taken along line 4B-4B of FIG. 4A, assuming that FIG. 4A is a plan view of a pixel interleaved array type solid state image pickup device such as shown in FIG. 3B.

A different point of FIG. 4C from the cross sectional view shown in FIG. 4B resides in that the vertical transfer channel 64 under the vertical transfer electrode 75 is divided into two regions by the channel stop regions 76. Also in the pixel interleaved array type solid state image pickup device, the effective pixel region 58 differs from the optical black region 59 in that the opening 79a is formed through the light shielding film 79 above the charge accumulation region 71.

In the optical black region 59, incidence light is shielded by the light shielding film 79. Therefore, only dark noises are generally generated in the photodiodes or vertical transfer channels 64 in the optical black region 59, and these dark noises are a signal in the optical black region 59. A normal output signal in the effective pixel region 58 often adopts a value of a signal obtained in the effective pixel region 58 subtracted by a black reference signal (i.e., dark noises) which is a signal in the optical black region 59.

Signal charges will not enter usually the optical black region 59 from the effective pixel region 58. This is because there is the above-described vertical type overflow drain function.

However, when very strong light becomes incident upon the region of the effective pixel region 58 near the optical black region 59, in some cases, electrons generated in the well 82 through photoelectric conversion are not drained to the n-type semiconductor substrate 81 but diffuse and leak into the vertical channels 64 in the optical black region 59. Particularly, while a read pulse voltage is applied to the transfer gate to read signal charges from the charge accumulation region 71 to the vertical transfer channel 64, a potential under the electrode applied with the read voltage becomes lower than the potential at the vertical type overflow drain structure. It can therefore be considered that the vertical type overflow drain does not function sufficiently and leak of charges into the optical black region 59 occurs more likely (for example, refer to JP-A-2003-224255).

Leak of charges into the optical black region 59 results in a lower signal in the effective pixel region 58 and may corrupt a photographed image, because the black reference signal contains the leak components in addition to the dark noises when the normal output signal in the effective pixel area 58 is calculated.

Although pixels are made fine in recent years, a transmission depth of light into silicon will not change. It is not easy to control motion of carriers generated at a deep position. Therefore, the above-described disadvantages occur more likely as solid state image pickup devices are made more compact.

SUMMARY OF THE INVENTION

An object of this invention is to provide a solid state image pickup device capable of photographing a good quality image.

According to one aspect of the present invention, there is provided a solid state image pickup device comprising: a semiconductor substrate of a first conductivity type having a light reception region defined in the semiconductor substrate; a well of a second conductivity type opposite to the first conductivity type, the well being formed in the semiconductor substrate; a plurality of charge accumulation regions of the first conductivity type disposed in the well in the light reception region in a matrix shape, the charge accumulation region storing signal charges generated in correspondence to an amount of incidence light; a vertical transfer channel of the first conductivity type disposed in the well in the light reception region along each column of the charge accumulation regions disposed in the matrix shape, the vertical transfer channel transferring signal charges accumulated in and read from the charge accumulation regions along a column direction; a light shielding film formed above a surface of the semiconductor substrate in an area including the light reception region; and a horizontal transfer channel of the first conductivity type formed in the well and connected to ends of the vertical transfer channels, the horizontal transfer channel transferring the signal charges transferred from the vertical transfer channels along a row direction, wherein the light reception region comprises: a first region in which an opening is formed through the light shielding film above each of the charge accumulation regions; a second region in which an opening is not formed through the upper light shielding film; and a third region defined between the first and second regions along the column direction of the charge accumulation regions, the third region not having at least partially the well and not having an opening formed through the upper light shielding film.

According to another aspect of the present invention, there is provided a solid state image pickup device comprising: a semiconductor substrate of a first conductivity type having a light reception region defined in the semiconductor substrate; a well of a second conductivity type opposite to the first conductivity type, the well being formed in the semiconductor substrate; a plurality of charge accumulation regions of the first conductivity type disposed in the well in the light reception region in a matrix shape, the charge accumulation region storing signal charges generated in correspondence to an amount of incidence light; a vertical transfer channel of the first conductivity type disposed in the well in the light reception region along each column of the charge accumulation regions disposed in the matrix shape, the vertical transfer channel transferring signal charges accumulated in and read from the charge accumulation regions along a column direction; a light shielding film formed above a surface of the semiconductor substrate in an area including the light reception region; and a horizontal transfer channel of the first conductivity type formed in the well and connected to ends of the vertical transfer channels, the horizontal transfer channel transferring the signal charges transferred from the vertical transfer channels along a row direction, wherein the light reception region comprises: a first region in which an opening is formed through the light shielding film above each of the charge accumulation regions; a second region in which an opening is not formed through the upper light shielding film; and a third region defined between the first and second regions along the column direction, the third region not formed with the charge accumulation regions and the vertical transfer channels and not having an opening formed through the upper light shielding film.

A solid state image pickup device can be provided which can photograph a good quality image.

DESCRIPTION OF THE PREFERRED EMBODIMENTS

Figure 1A:
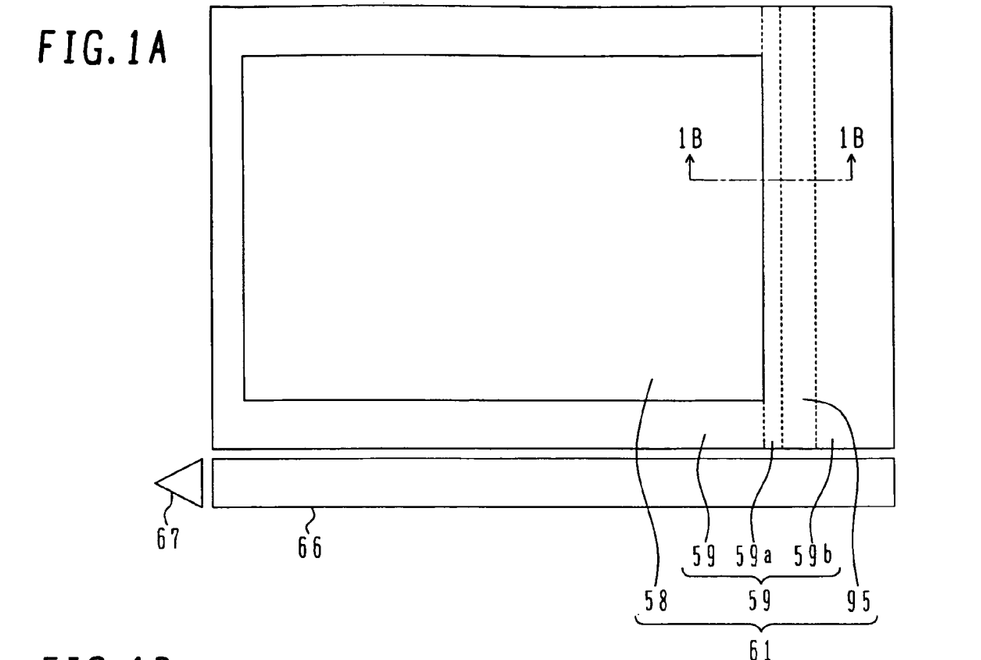
FIG. 1A is a schematic plan view showing the structure of a CCD type solid state image pickup device according to an embodiment.
Figure 1B:
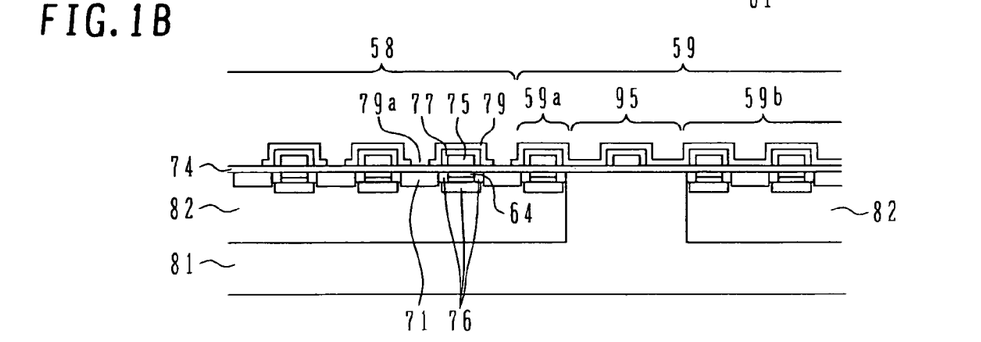
FIGS. 1B and 1C are cross sectional views taken along line 1B-1B shown in FIG. 1A.
Figure 1C:
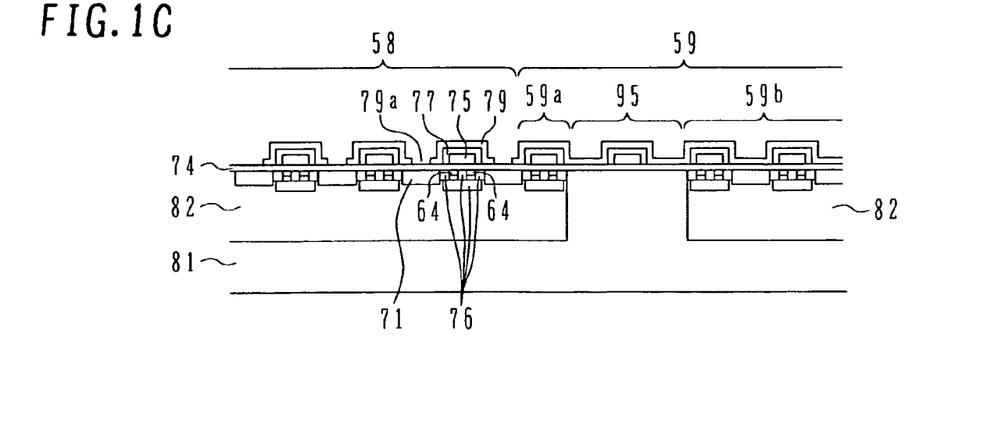

FIG. 1A is a schematic plan view showing the structure of a CCD type solid state image pickup device according to the embodiment, and FIGS. 1B and 1C are cross sectional views taken along line 1B-1B shown in FIG. 1A.

The CCD type solid state image pickup device of the embodiment is characterized in the structure of the optical black region shown in FIGS. 4A to 4C, and the other structures adopt the structures similar to those described with reference to FIGS. 3A to 3E.

Reference is made to FIG. 1A. FIG. 1A is a plan view corresponding to FIGS. 3A and 3B. FIG. 1A does not show the photosensitive regions 62, vertical transfer channels (vertical CCDs) 64 and channel stop regions 76 shown in FIGS. 3A and 3B. In FIG. 1A, the up/down (longitudinal) direction of the drawing is a vertical direction (column direction), and photosensitive regions are formed along the up/down direction and a right/left direction (lateral direction, row direction) in the drawing. Vertical transfer channels are formed along the up/down direction in the drawing in the case of a tetragonal array, and along the up/down direction in a zigzag shape in the drawing in the case of a pixel interleaved array.

A rectangular light reception region (pixel array region) 61 constituted of photosensitive regions, vertical transfer channels (vertical CCDs) and the like includes an effective pixel region 58, an optical black region 59 and a well-less region 95. A size of the light reception region (pixel array region) 61 is, for example, 4100 μm in a longitudinal direction and 5500 μm in a lateral direction, although the size changes depending upon a cell pitch and the number of pixels.

The effective pixel region 58 is defined in a non-peripheral area (central area) of the light reception region (pixel array region) 61, for example, as a rectangular area. In the effective pixel region 58, an opening is formed through the light shielding film above the charge accumulation region. A size of the effective pixel region 58 is, for example, 4080 μm in a longitudinal direction and 5400 μm in a lateral direction.

The optical black region 59 includes an evaluation region 59a for evaluating leak light and the like and a black reference signal measurement region 59b for measuring a black reference signal, and is formed surrounding the effective pixel region 58. In the optical black region 59, an opening is not formed through the light shielding film above the charge accumulation region (the light shielding film covers a region above the charge accumulation region). As will be later described, it is not necessarily required that the optical black region 59 is formed surrounding the effective pixel region 58.

In the solid state image pickup device of the embodiment, the evaluation region 59a is formed at a position adjacent to the effective pixel region 58 along the longitudinal direction. The black reference signal measurement region 59b is formed on the right side end (on the side opposite to the side where the charge detection unit 67 is formed, on the upstream side along the horizontal direction) of the light reception region (pixel array region) 61 along the longitudinal direction.

The well-less region 95 is formed between the evaluation region 59a and black reference signal measurement region 59c along the vertical direction. The light shielding film without opening is formed above the well-less region 95.

FIG. 1B is a cross sectional view taken along line 1B-1B of FIG. 1A, assuming that FIG. 1A is a plan view of an inter-line type solid state image pickup device such as shown in FIG. 3A. FIG. 1B is partially simplified more than the cross sectional view of FIG. 3D.

The light reception region (pixel array region) 61 includes the effective pixel region 58, optical black region 59 and well-less region 95. In the effective pixel region 58 and optical black region 59, charge accumulation regions 71, vertical transfer channels 64 and channel stop regions 76 are formed in a well 82 formed in a semiconductor substrate 81. Vertical transfer electrodes 75, a silicon oxide film 77 and the light shielding film 79 are formed above the semiconductor substrate 81 with an insulating film 74 formed on the surface thereof.

Of the optical black region 59, the evaluation region 59a is formed adjacent to the effective pixel region 58 and constituted of photodiodes (charge accumulation regions 71) of at least one column.

The well-less region 95 is formed adjacent to the evaluation region 59a and has a width of, e.g., 3 to 15 μm. In the well-less region 95, the well 82 is not formed in the semiconductor substrate 81. Impurity doped regions are neither formed, such as the charge accumulation region 71, vertical transfer channel 64, channel stop region 76 and the like.

Of the optical black region 59, the black reference signal measurement region 59b is a region defined adjacent to the well-less region 95 and on the upstream side in the horizontal direction.

FIG. 1C is a cross sectional view taken along line 1B-1B of FIG. 1A, assuming that FIG. 1A is a plan view of a pixel interleaved array type solid state image pickup device such as shown in FIG. 3B.

A different point of the cross sectional view of FIG. 1C from the cross sectional view of FIG. 1B resides in that the vertical transfer channel 64 under the vertical transfer electrode 75 is divided into two portions by the channel stop regions 76.

As shown in FIGS. 1A to 1C, the following advantages are obtained by forming the evaluation region 59a, black reference signal measurement region 59b and well-less region 95.

First, in the well-less region 95, the p-type well 82 is not formed which otherwise forms a potential barrier along the direction toward the semiconductor substrate 81. Namely, in the well-less region 95, a barrier along a depth direction of the semiconductor substrate 81 is not formed or is very low, and a low potential region relative to electrons is formed through the semiconductor substrate 81 along the depth direction. It is therefore possible to drain charges entered the well-less region 95 to the semiconductor substrate 81 side easily. Accordingly, even if charges are diffused in response to incidence of strong light upon the effective pixel region 58 near the evaluation region 59a, the diffused charges are drained to the semiconductor substrate 81 in the well-less region 95. It is possible to prevent charges from entering the optical black region 59 (black reference signal region 59b) on the more upstream side than the well-less region 95 in the horizontal direction. A correct black reference signal can therefore be measured in the black reference signal measurement region 59b. This is also applicable to the case in which the vertical type overflow drain does not function sufficiently (the case in which a read pulse voltage is applied to the transfer gate to read signal charges from the charge accumulation region to the vertical transfer channel).

The evaluation region 59a is a region for evaluating an influence degree of the effective pixel region 58. By comparing a charge amount measured in the black reference signal measurement region 59b with a charge amount measured in the evaluation region 59a, it becomes possible to detect and evaluate a charge leak amount from the effective pixel region 58 such as smear and blooming. It is also possible to evaluate a charge transfer efficiency in the horizontal transfer channel.

The present inventors manufactured CCD type solid state image pickup devices (pixel interleaved array type solid state image pickup devices) of the embodiment and conducted experiments. Even if a high luminance target image such as the Sun was photographed, a lowered or reduced signal in the effective pixel region 58 was able to be suppressed and a good quality image was obtained. It has been found that the suppression effect depends on the width of the well-less region 95 and the suppression effect becomes larger as the width is wider.

The present invention has been described in connection with the preferred embodiment. The invention is not limited only to the above embodiment.

FIGS. 2A to 2D are schematic plan views showing modifications of the embodiment.

Figure 2A:
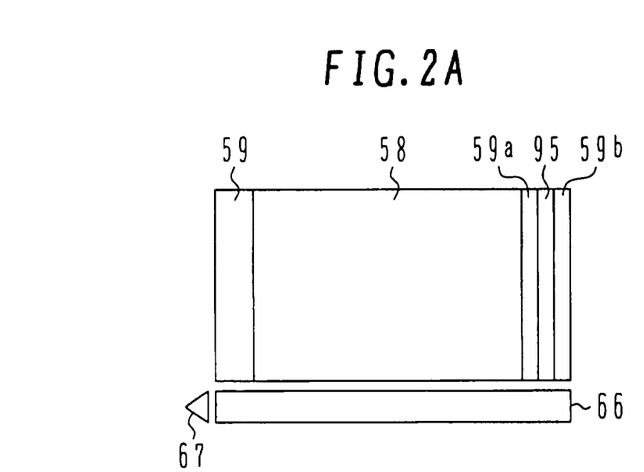
FIGS. 2A to 2D are schematic plan views showing modifications of the embodiment.
Figure 2B:
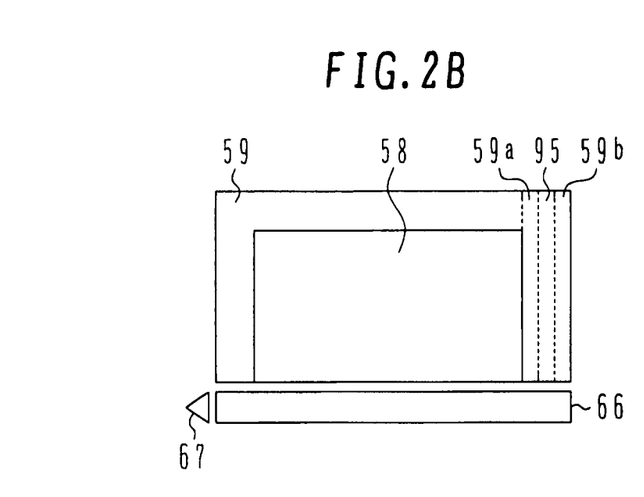

For example, as shown in FIGS. 2A and 2B, the optical black region 59 is not necessary to be formed surrounding the effective pixel region 58.

Figure 2C:
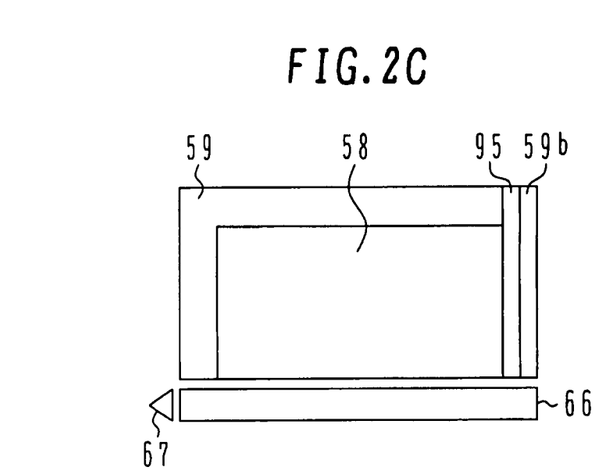

Further, as shown in FIG. 2C, the well-less region 95 may be formed at a position adjacent to the effective pixel region 58, without forming the evaluation region 59a.

Figure 2D:
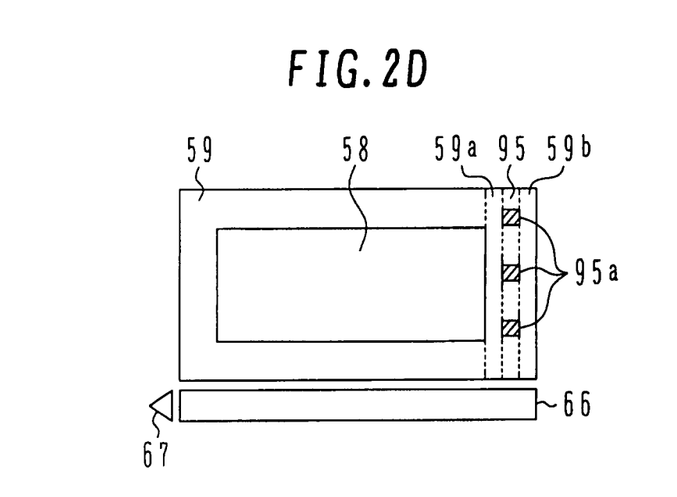

Furthermore, as shown in FIG. 2D, wells may be formed in some regions of the well-less region 95. In FIG. 2D, the regions where wells are formed are well formed regions 95a indicated by hatching.

In this specification, although the optical black region 59 and well-less region 95 have been described discretely, the well-less region 95 may be considered as a portion of the optical black region 59.

It will be apparent to those skilled in the art that other various modifications, improvements, combinations, and the like can be made.

The present invention is applicable to CCD type solid state image pickup devices.

What we claim are:

1. A solid state image pickup device comprising:
a semiconductor substrate of a first conductivity type having a light reception region defined in said semiconductor substrate;

a well of a second conductivity type opposite to said first conductivity type, said well being formed in said semiconductor substrate;

a plurality of charge accumulation regions of said first conductivity type disposed in said well in said light reception region in a matrix shape, said charge accumulation region storing signal charges generated in correspondence to an amount of incidence light;

a vertical transfer channel of said first conductivity type disposed in said well in said light reception region along each column of said charge accumulation regions disposed in said matrix shape, said vertical transfer channel transferring signal charges accumulated in and read from said charge accumulation regions along a column direction;

a light shielding film formed above a surface of said semiconductor substrate in an area including said light reception region; and a horizontal transfer channel of said first conductivity type formed in said well and connected to ends of said vertical transfer channels, said horizontal transfer channel transferring said signal charges transferred from said vertical transfer channels along a row direction, wherein said light reception region comprises:

a first region in which an opening is formed through said light shielding film above each of said charge accumulation regions;

a second region in which an opening is not formed through said upper light shielding film; and a third region defined between said first and second regions along the column direction of said charge accumulation regions, said third region not having at least partially said well and not having an opening formed through said upper light shielding film.

2. The solid state image pickup device according to claim 1, wherein said light reception region further comprises a fourth region defined between said first and third regions along the column direction of said charge accumulation regions, said fourth region including said vertical transfer channel of at least one column and not having an opening formed through said upper light shielding film.

3. The solid state image pickup device according to claim 1, wherein said third region is not formed with said charge accumulation regions and said vertical transfer channels.

4. The solid state image pickup device according to claim 1, wherein said first conductivity type is an n-type.

5. A solid state image pickup device comprising:
a semiconductor substrate of a first conductivity type having a light reception region defined in said semiconductor substrate;

a well of a second conductivity type opposite to said first conductivity type, said well being formed in said semiconductor substrate;

a plurality of charge accumulation regions of said first conductivity type disposed in said well in said light reception region in a matrix shape, said charge accumulation region storing signal charges generated in correspondence to an amount of incidence light;

a vertical transfer channel of said first conductivity type disposed in said well in said light reception region along each column of said charge accumulation regions disposed in said matrix shape, said vertical transfer channel transferring signal charges accumulated in and read from said charge accumulation regions along a column direction;

a light shielding film formed above a surface of said semiconductor substrate in an area including said light reception region; and a horizontal transfer channel of said first conductivity type formed in said well and connected to ends of said vertical transfer channels, said horizontal transfer channel transferring said signal charges transferred from said vertical transfer channels along a row direction, wherein said light reception region comprises:

a first region in which an opening is formed through said light shielding film above each of said charge accumulation regions;

a second region in which an opening is not formed through said upper light shielding film; and a third region defined between said first and second regions along the column direction, said third region not formed with said charge accumulation regions and said vertical transfer channels and not having an opening formed through said upper light shielding film.

* * * * *